United States Patent [19]
Williams

[11] Patent Number: 6,096,608
[45] Date of Patent: Aug. 1, 2000

[54] BIDIRECTIONAL TRENCH GATED POWER MOSFET WITH SUBMERGED BODY BUS EXTENDING UNDERNEATH GATE TRENCH

[75] Inventor: Richard K. Williams, Cupertino, Calif.

[73] Assignee: Siliconix Incorporated, Santa Clara, Calif.

[21] Appl. No.: 09/186,216

[22] Filed: Nov. 3, 1998

Related U.S. Application Data

[63] Continuation of application No. 08/884,826, Jun. 30, 1997, Pat. No. 5,877,538.

[51] Int. Cl.[7] .................................................. H01L 21/336
[52] U.S. Cl. ........................... 438/270; 438/238; 438/274; 438/589
[58] Field of Search .................................. 438/138, 270, 438/274, 152, 589, 238

[56] References Cited

U.S. PATENT DOCUMENTS

| | | | |
|---|---|---|---|
| 4,799,095 | 1/1989 | Baliga | 357/38 |
| 4,876,215 | 10/1989 | Hsu | 438/209 |
| 4,914,058 | 4/1990 | Blanchard | 437/203 |
| 4,961,100 | 10/1990 | Baliga et al. | 357/39 |
| 4,994,871 | 2/1991 | Chang et al. | 357/23.4 |
| 5,021,845 | 6/1991 | Hashimoto | 357/23.4 |
| 5,045,902 | 9/1991 | Bancal | 357/23.4 |
| 5,410,170 | 4/1995 | Bulucea et al. | 257/332 |
| 5,442,214 | 8/1995 | Yang | 257/328 |
| 5,468,982 | 11/1995 | Hshieh et al. | 257/331 |
| 5,489,787 | 2/1996 | Amaratunga et al. | 257/137 |
| 5,525,821 | 6/1996 | Harada et al. | 257/331 |
| 5,558,313 | 9/1996 | Hshieh et al. | 257/342 |
| 5,665,996 | 9/1997 | Williams et al. | 257/401 |
| 5,674,766 | 10/1997 | Darwish et al. | 437/40 |

FOREIGN PATENT DOCUMENTS

| | | | |
|---|---|---|---|
| 0583022 A2 | 2/1994 | European Pat. Off. | H01L 21/336 |
| 0656661 A1 | 6/1995 | European Pat. Off. | H01L 29/78 |
| 55-146976 | 5/1979 | Japan | H01L 29/78 |
| 56-74960 | 6/1981 | Japan | H01L 27/08 |
| 1-287966 | 12/1987 | Japan | H01L 29/78 |
| 2-50482 | 2/1990 | Japan | H01L 29/78 |
| 6-224437 | 8/1994 | Japan | H01L 29/78 |
| 7-66395 | 3/1995 | Japan | H01L 29/78 |
| 07142722 | 6/1995 | Japan | H01L 29/78 |
| 2269050 | 1/1994 | United Kingdom | H01L 29/06 |

*Primary Examiner*—Carl Whitehead, Jr.
*Assistant Examiner*—Maria Guerrero
*Attorney, Agent, or Firm*—Skjerven, Morrill, MacPherson, Franklin & Friel LLP; David E. Steuber

[57] ABSTRACT

A trench power MOSFET includes a body region which is not shorted to the source region and which is entirely covered by the source region within each cell of the MOSFET. The body region within each MOSFET cell is brought to the surface of the substrate (or epitaxial layer overlying the substrate) in an area outside of the MOSFET cell, and is connected to a body contact bus which is electrically insulated from the source bus. A deep diffusion of the same conductivity type as the body region may be formed adjacent the trench gate but outside of a MOSFET cell to protect the gate oxide from excessive field potentials at the corners of the gate. The deep diffusion is also connected to the body contact bus, which may include a metal layer, a submerged region of the second conductivity, or both.

4 Claims, 16 Drawing Sheets

BIDIRECTIONAL TRENCH GATED POWER MOSFET WITH SUBMERGED BODY BUS EXTENDING UNDERNEATH GATE TRENCH

CROSS REFERENCE TO RELATED APPLICATIONS

This application is related to the following, each of which is incorporated herein by reference in its entirety: application Ser. No. 08/459,555, filed Jun. 2, 1995 and now abandoned; application Ser. No. 08/159,900, filed Nov. 30, 1993, now U.S. Pat. No. 5,536,977; application Ser. No. 08/219,586, filed Mar. 29, 1994, now abandoned; application Ser. No. 08/160,560, filed Nov. 30, 1993, now U.S. Pat. No. 5,510,747; application Ser. No. 08/160,539, filed Nov. 30, 1993, now U.S. Pat. No. 5,420,451; and application Ser. No. 08/367,515, filed Dec. 30, 1994, now U.S. Pat. No. 5,689,209.

This Application is a continuation of application Ser. No. 08/884,826 Jun. 30, 1997, now U.S. Pat. No. 5,877,538.

FIELD OF THE INVENTION

This invention relates to vertical power MOSFETs having a gate formed in a trench and, in particular, to MOSFETs which are capable of blocking current bidirectionally.

BACKGROUND OF THE INVENTION

In a conventional power MOSFET, the source is often shorted to the body to prevent the parasitic bipolar transistor, consisting of the source, body and drain diffusions, from turning on as the MOSFET is operated. Bipolar turn-on is undesirable since it may result in a loss of voltage blocking capability (i.e., snapback), negative resistance which can cause oscillations, current crowding, hot spots and device destruction.

The source-body short is normally created by depositing a metal layer over both the source and body diffusions. As a result, an "antiparallel diode", represented by the junction of the body and drain, is formed in parallel with the channel of the MOSFET. This prevents the MOSFET from blocking current in the direction from the source to the drain, since such current would flow through the forward-biased antiparallel diode. Thus, to provide a bidirectional current blocking capability, two back-to-back MOSFETs are normally used. This back-to-back series arrangement doubles both the on-resistance and chip area of the device, resulting in a 4X penalty.

In trench-type MOSFETs, the source, body and drain regions are formed along the side of a trench which extends into the semiconductor material and which contains the gate. The current flows vertically through a channel adjacent to a wall of the trench. This offers the potential of a greater cell density and a lower resistance when the device is turned on. In trench MOSFETs, the source-body short is typically created by allowing the body diffusion to extend to the surface adjacent the source and depositing a metal layer over both diffusions.

Trench MOSFETs have suffered from the problem of excessive electric fields at the corners of the trenches, which can cause avalanche breakdown and thereby damage or rupture the gate oxide layer at these locations. U.S. Pat. No. 5,072,266 teaches the use of a deep body diffusion at the center of the cell to reduce the field strength at the gate oxide layer.

Both the need to create a source-body short at the surface of the device and the creation of a deep body diffusion tend to limit the cell density and consequently increase the on-resistance of the MOSFET.

Accordingly, there is a need for a bidirectional current blocking power MOSFET in which the gate oxide layer is protected against damage from electric field stress in a manner which does not limit the cell density of the device.

SUMMARY OF THE INVENTION

In the power MOSFET of this invention, the gate is disposed in a trench which is formed at the surface of the semiconductor material (a substrate or an epitaxial layer formed on a substrate). The gate is formed in a pattern which defines a plurality of active MOSFET cells. In the active MOSFET cells, a source region is formed at the surface of the substrate (or epitaxial layer), and a body region is formed under the source region. The body region does not extend to the surface in the active MOSFET cells. Rather, the body extends laterally to a region outside of the MOSFET cell where the body is brought to the surface. An electric contact to the body is formed in the region outside of the MOSFET cell. This allows the body to be biased independently of the source and drain and converts a typical three-terminal power MOSFET into a four-terminal device. In this way, the inherent diodes formed at the body-source and body-drain junctions can be prevented from becoming forward-biased.

In one embodiment according to the invention, the MOSFET cells are formed as a series of parallel "stripes" in an epitaxial layer, each cell being bounded on two sides by parallel gate trenches. The body regions in the MOSFET cells are in electrical contact with a body contact bus which runs in a direction orthogonal to the cells. The body contact bus may include a metal layer and/or a submerged region of the same conductivity type as the body regions.

According to another aspect of the invention, the strength of the electric field at the corners of the trenches is controlled by providing a relatively deep diffusion, of the same conductivity type as the body, outside of the MOSFET cells. In one embodiment, selected active MOSFET cells are in effect replaced by inactive cells which contain the deep diffusion. This pattern is repeated throughout the MOSFET, there being one inactive cell for a predetermined number of active cells. The active MOSFET cells do not contain a deep body diffusion (of the kind described in U.S. Pat. No. 5,072,266), and therefore the active cells may be packed more densely than MOSFET cells which contain a deep body diffusion.

Preferably, the deep diffusions in the inactive cells are connected to the body contact bus so that the body regions in the active cells are electrically shorted to the deep diffusions in the inactive cells.

DESCRIPTION OF THE INVENTION

Figure 1:
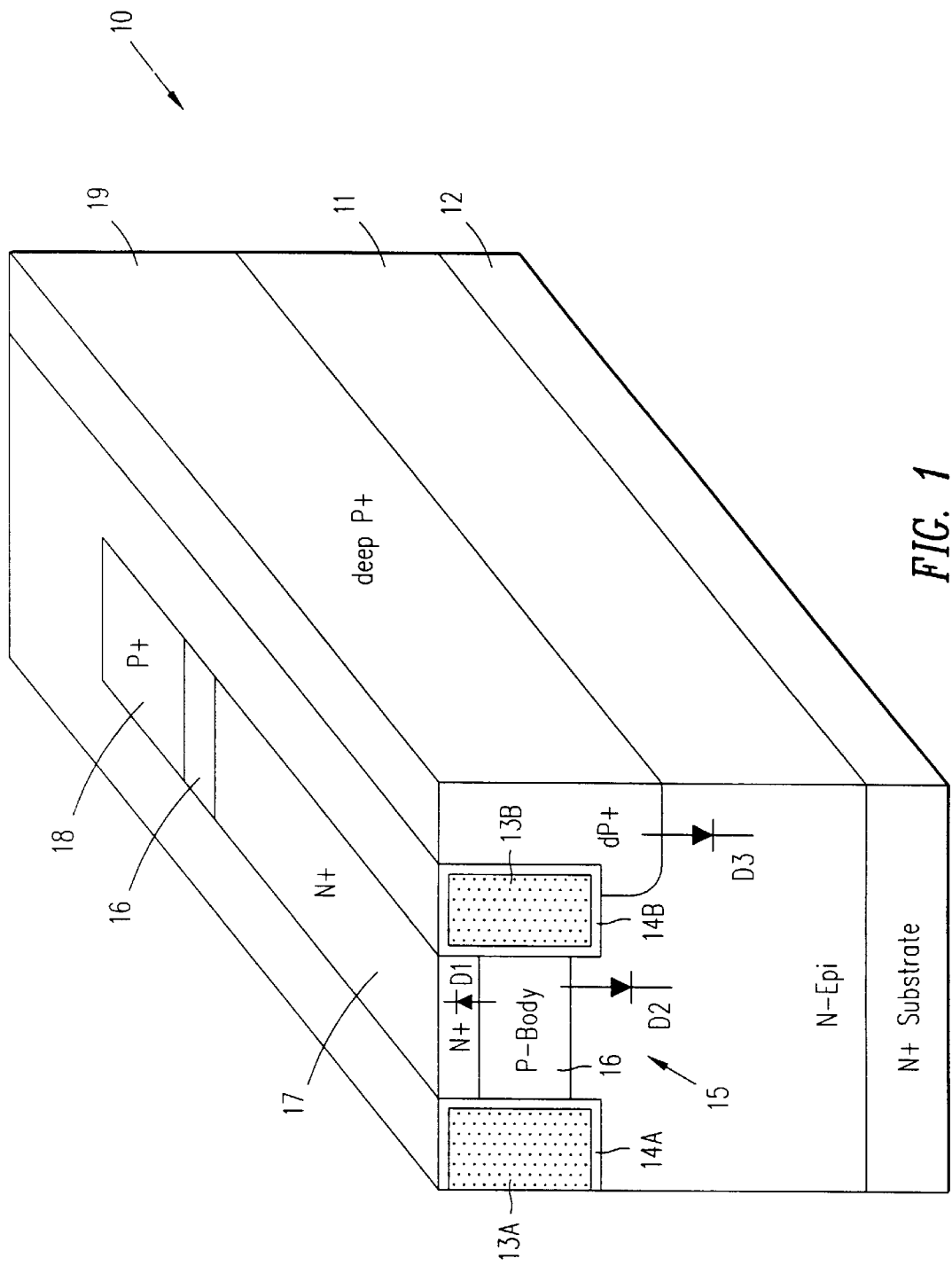
FIG. 1 illustrates a three-dimensional cross-sectional view of a trench power MOSFET in accordance with the invention.
Figure 3A:
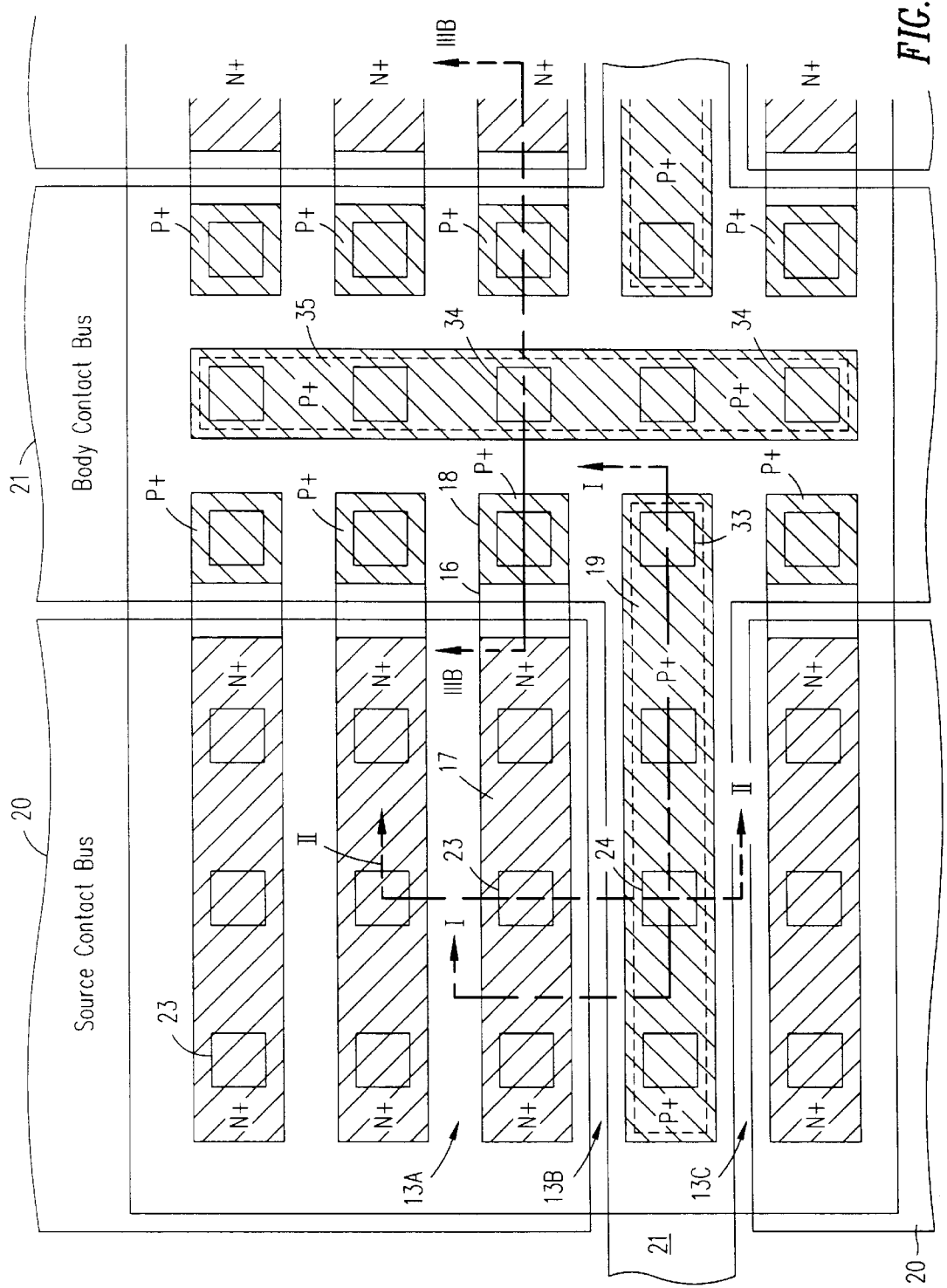
FIG. 3A illustrates a top view of the MOSFET shown in FIG. 1, showing in addition a deep body contact diffusion running parallel to the metal body bus.

FIG. 1 illustrates an three-dimensional cross-sectional view of an N-channel power MOSFET 10 in accordance with the invention, taken at cross-section I—I shown in FIG. 3A. MOSFET 10 includes an N− silicon epitaxial layer 11 which is grown on the surface of an N+ silicon substrate 12. Polysilicon gates 13A and 13B are formed in a pair of parallel trenches that are etched in the top surface of epitaxial layer 11. Gates 13A and 13B are electrically connected and are surrounded by insulating silicon dioxide layers 14A and 14B, respectively.

An active MOSFET cell 15 lying between gates 13A and 13B contains a P body region 16 and an N+ source region 17. N+ substrate 12 serves as the drain of MOSFET 10 and may be contacted from the bottom. Alternatively, a submerged N+ layer instead of the N+ substrate could be used as the drain, and the drain could be contacted from the top side of the structure by means of, for example, an N+ sinker region and a top side contact.

Body region 16 does not extend to the surface of epitaxial layer 11 within cell 15 but is brought to the surface behind N+ source region 17. A relatively shallow P+ contact region 18 is formed where P body region reaches the surface. A deep P+ diffusion 19 extends downward from the surface between gate 13B and the neighboring gate (not shown in FIG. 1).

Figure 2:
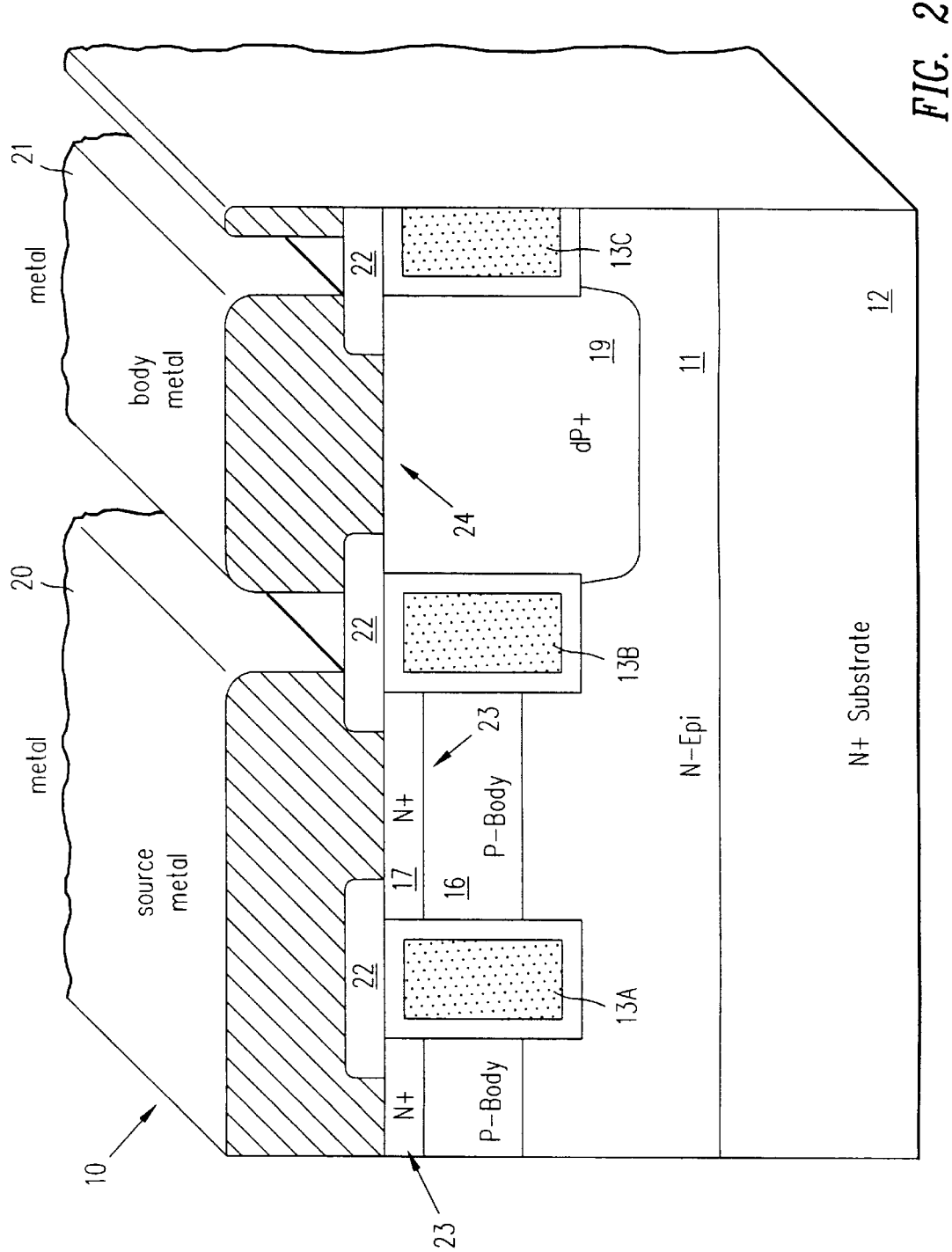
FIG. 2 illustrates a cross-sectional view of the trench power MOSFET shown in FIG. 1, showing in addition metal source and body buses on top of the structure.

FIG. 2 illustrates another cross-sectional view of MOSFET 10, taken at cross-section II—II shown in FIG. 3A, with deep P+ diffusion 19 extending laterally to a gate 13C. In addition, FIG. 2 shows a metal layer which forms a source contact bus 20 in contact with N+ source region 17 and a body contact bus 21 in contact with deep P+ diffusion 19. The manner of contacting P− body region 16 is shown below. An oxide insulating layer 22 covers the top surface of epitaxial layer 11, insulating layer 22 being punctuated by a contact hole 23, which connects source contact bus 20 to N+ source region 17, and a contact hole 24, which connects body contact bus 21 to deep P+ diffusion 19.

FIG. 3A illustrates a top view of MOSFET 10. As shown, source contact bus 20 provides contact to N+ source regions 17 by means of contacts 23. Although contacts 23 are shown as squares, the contacts may also be in the form of long, continuous stripes, a succession of interrupted stripes, or rectangles. Body contact bus 21 extends over shallow P+ contact regions 18 and deep P+ region 19 and provides electrical contact to P body regions 16 (not visible in FIG. 3A) by means of contacts 33 and to deep P+ diffusions 19 by means of contacts 24. Buses 20 and 21 are insulated from the top surface of the epitaxial layer 11 by insulating layer 22 (not shown in FIG. 3A). In addition, contacts 34 connect body contact bus 21 to a deep P+ region 35, which runs under body contact bus 21. As a result, bus 21 provides contact to both P body regions 16 (via shallow P+ contact regions 18) and deep P+ region 19. Deep P+ region 35 provides an additional current path to P body region 16 and deep P+ region 19.

Figure 3B:
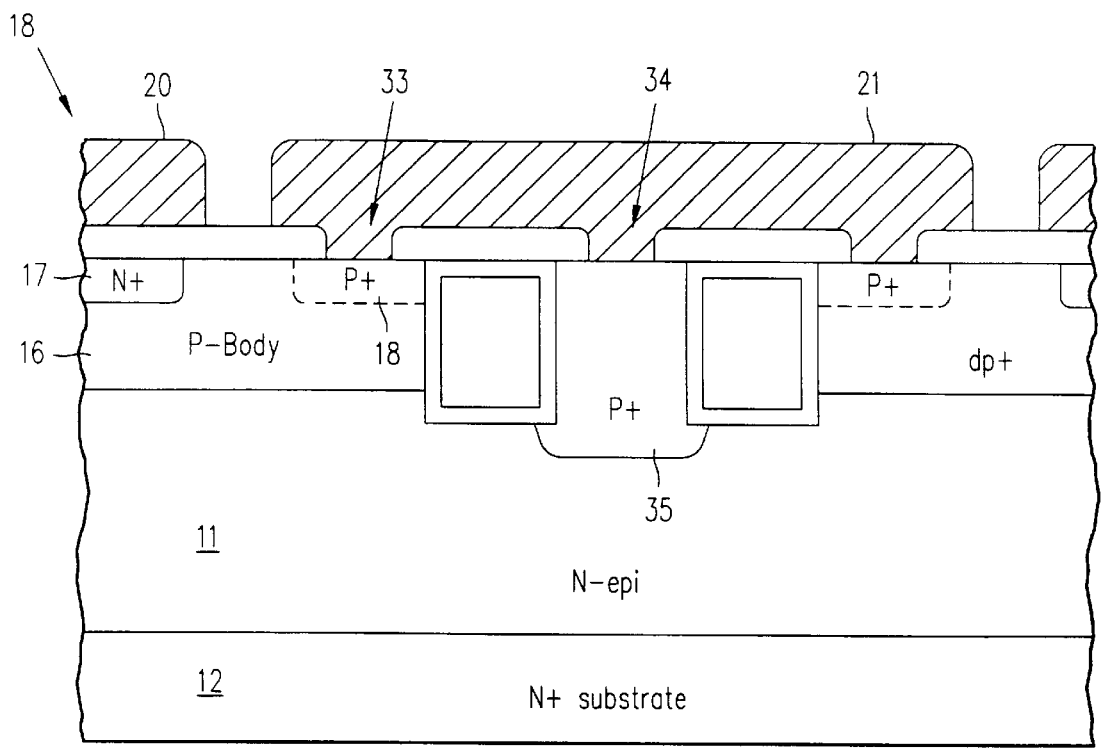
FIG. 3B illustrates a cross-sectional view of the MOSFET shown in FIG. 1 taken at a section spanning the metal body contact bus and parallel deep diffusion.

FIG. 3B shows a cross-sectional view taken at section IIIB—IIIB shown in FIG. 3A. In particular, FIG. 3B shows how P body region 16 extends beyond the termination of N+ source region 17 and makes contact with body contact bus 21 through P+ contact region 18 and contact 33. FIG. 3B also shows deep P+ region 35, which contacts body contact bus 21 through contact 34.

Figure 4:
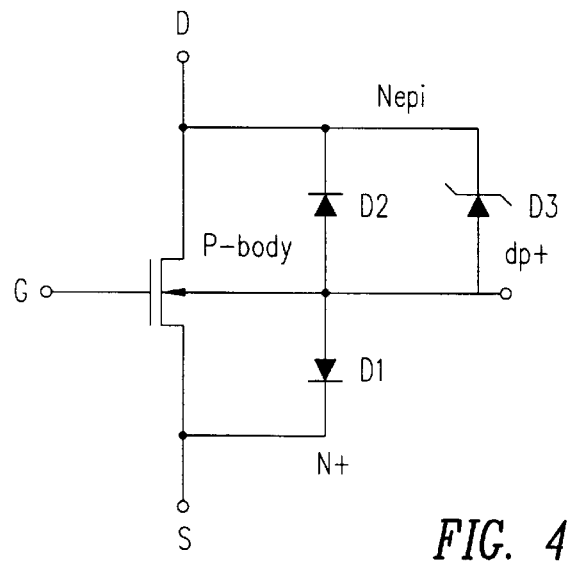
FIG. 4 illustrates an equivalent circuit diagram of the power MOSFET shown in FIGS. 1–3.

FIG. 4 illustrates a schematic circuit representation of MOSFET 10. As shown, MOSFET 10 is a four-terminal device, having the conventional connections to the gate (13A,13B), the source (N+ region 17) and the drain (N+ substrate 12). In addition, a contact is made in common to body region 16 and to deep P+ region 19, through body contact bus 21 and vias 33 and 24, respectively. A diode D1 represents the junction between P body 16 and N+ source 17 within cell 15. A diode D2 represents the junction between P body 16 and the drain (N− epitaxial layer 11 and N+ substrate 12), and a Zener diode D3 represents the junction between deep P+ region 19 and the drain (N− epitaxial layer 11 and N+ substrate 12). As is evident from FIGS. 1 and 4, diodes D2 and D3 are connected in parallel.

Unlike most vertical power MOSFETs, which incorporate a source-body short within the MOSFET cell, the embodiment shown in FIGS. 1–4 allows P body region 16 to be separately biased to prevent either the N+ source-to-body diode (D1) or the drain-to-body diode (D2) from becoming forward-biased. The maximum breakdown of diode D1 is set by the surface concentration of P body 16 in the area where N+ source 17 terminates and the P body region 16 begins. Along the remainder of the "stripe" between gates 13A and 13B, P body region 16 is buried below N+ source 17 and does not reach the surface, thereby avoiding any surface breakdown.

Diode D1 typically exhibits a breakdown voltage of from 6V to 12V for normal body doping concentrations. The breakdown voltage of diode D1 is unlikely to exceed 15V in any reasonable process circumstances. The breakdown voltage of diode D2 can be set to virtually any voltage from 6V to 60V, with 15V or 30V being desirable voltages for many applications involving battery chargers. The improper selection of the breakdown voltage of diode D2 can lead to high electric fields at the corners of the trench.

This problem is alleviated by the inclusion of the deep P+ diode (D3), which breaks down before high electric fields or impact ionization at the corners of the trench can lead to hot carrier formation. The voltage clamp of diode D3 is set up by designing diode D3 to have a breakdown voltage lower than the breakdown voltage of diode D2 and by connecting deep P+ region 19 (the anode of diode D3) through body contact bus 20 to P body region 16 (the anode of diode D2). The breakdown voltage of diode D3 may be adjusted by changing the dopant concentration of deep P+ region 19 or the distance between the bottom of deep P+ region 19 and N+ substrate 12. A net spacing of from 0.5 to 2.5 μm between the bottom of deep P+ region 19 and N+ substrate 12 may be used to provide suitable voltage clamping. A graph showing the breakdown voltage of a PIN diode such as diode D3 as a function of the doping concentration and width of the intermediate or "intrinsic" region is provided in S. M. Sze, *Physics of Semiconductor Devices*, Second Edition, John Wiley & Sons (1981), p. 105, FIG. 32, which is incorporated herein by reference.

In reality, the selection of the relative breakdown voltages of the intrinsic diode D2 and the clamping diode D3 is normally dictated by reliability considerations, but in general diode D3 should break down before diode D2. At the other extreme, it is unlikely that diode D3 would need to have a breakdown voltage that is any lower than 50% of the breakdown voltage of diode D2.

Figure 5:
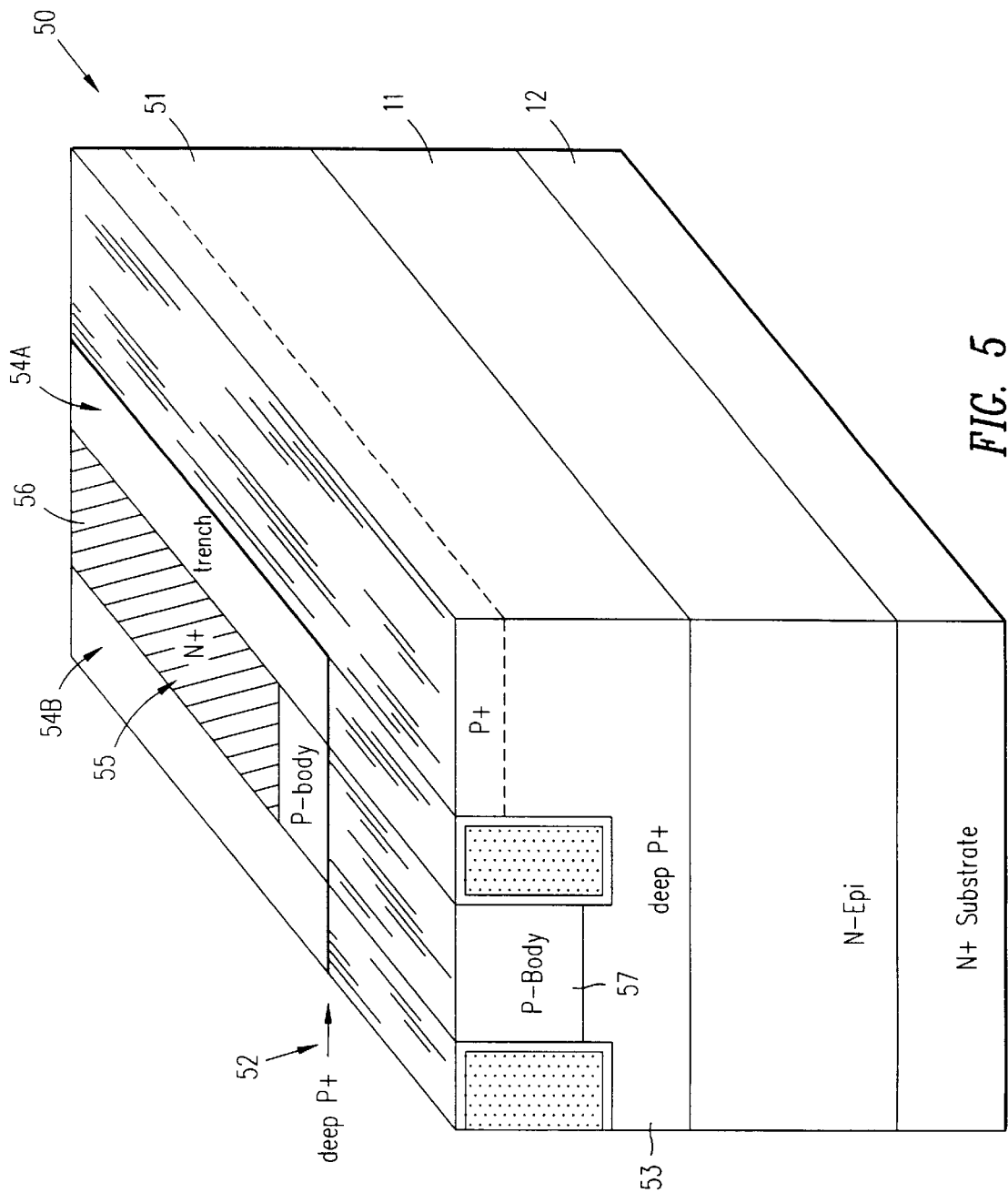
FIG. 5 illustrates a three-dimensional cross-sectional view of a second embodiment according to the invention, which includes a submerged body contact bus.

An alternative bus structure for connecting the body regions together is illustrated in FIG. 5, which illustrates a cross-sectional view of a MOSFET 50 taken through a submerged body bus 52. Body bus 52 essentially substitutes for the body contact bus 21 shown in FIG. 3A. A deep P+ region 51, similar to deep P+ region 19 in FIG. 1, abuts the side of a trench gate 54A and provides electric field protection for MOSFET cell 55. The N+ source region 56 of MOSFET cell 55 is also shown, as is the extension of P-body region 57 from MOSFET cell 55. Note that trench gates 54A and 54B run completely through the submerged body bus 52 to define MOSFET cells (not shown) on the other side of submerged body bus 52.

Submerged bus 52 includes a deep P+ region 53 which abuts P-body region 57 and extends under gates 54A and 54B, thereby eliminating the need for a surface metal bus. As shown, deep P+ region 53 is held back from the end of N+ source region 56 to prevent the formation of a heavily-doped P+/N+ junction at the surface, which might significantly reduce the breakdown voltage of the source-to-body diode D1 shown in FIG. 4. This would reduce the effectiveness of MOSFET 50 as a bidirectional current blocking device.

Figure 6:
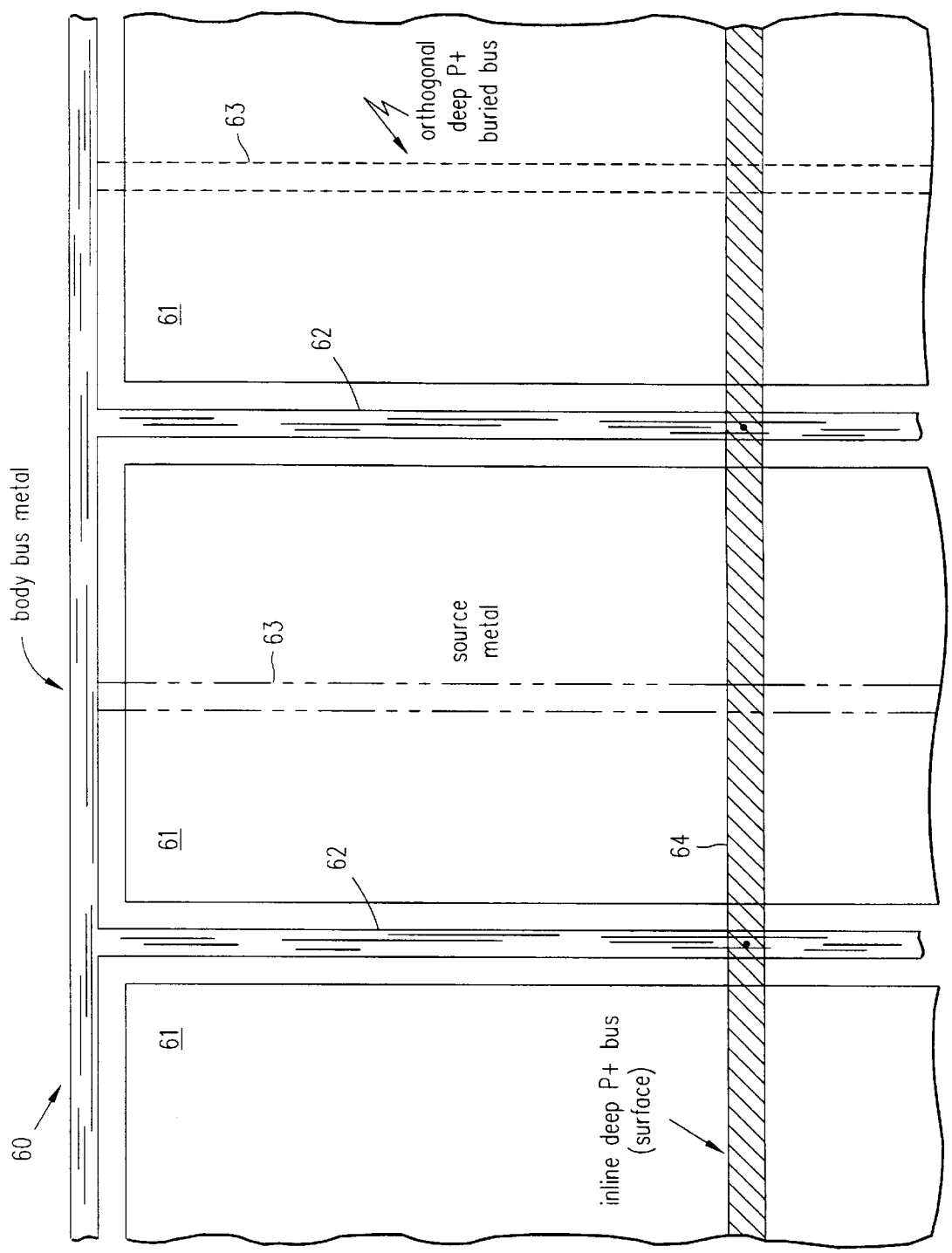
FIG. 6 illustrates a top view of a power MOSFET which includes both metal and submerged body contact busses.

A single MOSFET may combine the metal body contact bus 21 of FIG. 3A with the submerged body bus 52 of FIG. 5, as shown in FIG. 6. In MOSFET 60, relatively large blocks of source contact metal 61 run over the MOSFET cells (not shown) with contacts extending through an insulating layer to connect metal 61 to the source regions of the individual MOSFET cells. Metal body contact buses 62 run orthogonally to the MOSFET cells in the manner of bus 21 shown in FIG. 3A. Submerged body contact buses 63, similar to bus 52 in FIG. 5, run parallel to and in between metal buses 62. A deep P+ bus 64, similar to metal bus 21 in FIG. 2, runs over a deep P+ region (similar to deep P+ region 19 shown in FIGS. 1 and 3) which provides electric field reduction for a selected number of MOSFET cells on both sides of line 64. The result is a grid of metal and submerged P+ buses running orthogonally to the MOSFET cells and submerged P+ buses running parallel to the MOSFET cells, all of which combine to provide a separate contact with the body regions within the MOSFET cells. The orthogonal submerged P+ buses should be held back from the N+ source regions of the MOSFET cells to prevent unwanted voltage breakdown from heavily doped P+/N+ junctions at the surface of the silicon. To prevent the deep P+ buses from influencing the breakdown of the junctions between the N+ source and P-body regions, the deep P+ buses should be held back from the N+ source regions by a distance at least equal to the lateral diffusion of the deep P+ buses (typically 80% of their depth). A common range for the lateral separation between the deep P+ buses and the N+ source regions is 1 to 8 μm, with 4 μm being typical. If thick metal is used for buses 61 and 62, the spacing may need to be enlarged to accommodate metal-to-metal spacing rules. The number and spacing of the buses is also determined by the amount of MOSFET cell area one is willing to sacrifice for the sake of a good body contact.

Figure 7A:
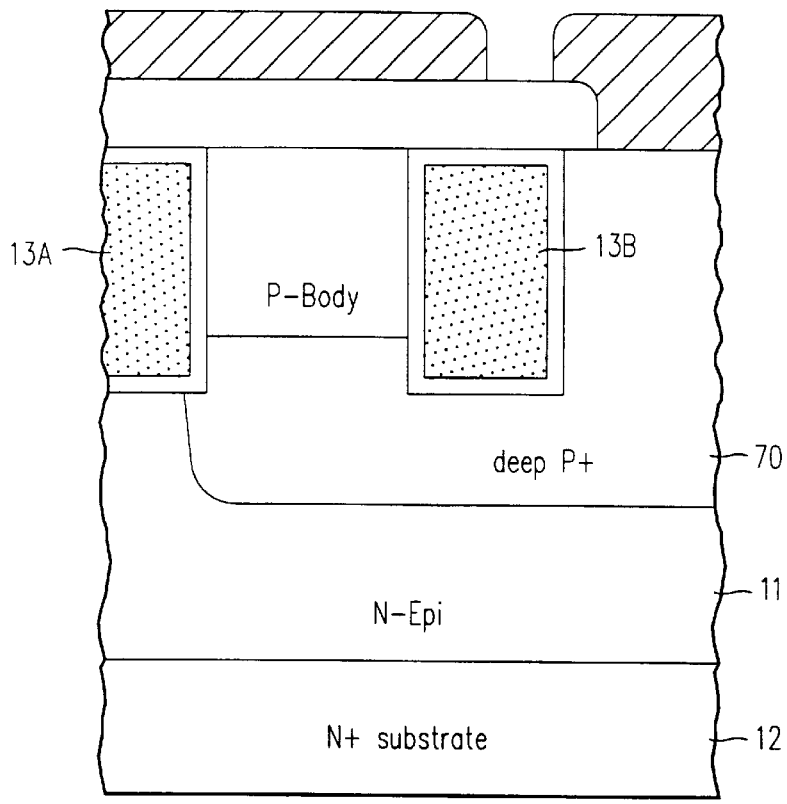
FIG. 7A illustrates a cross-sectional view of an embodiment in which the source region does not extend into the submerged body contact bus.
Figure 7B:
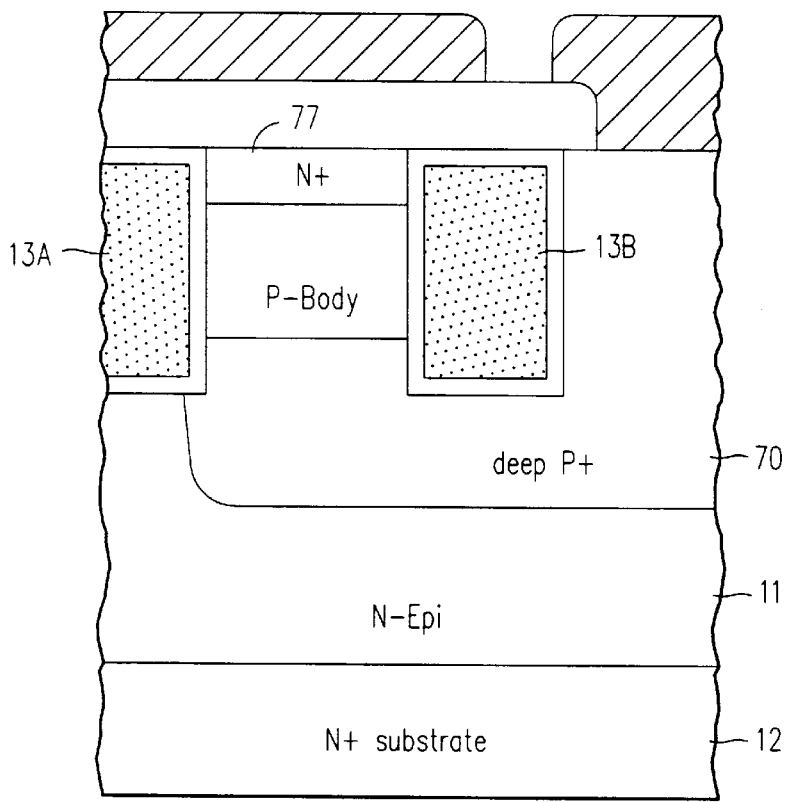
FIG. 7B illustrates an embodiment in which the source region does extend into the submerged body contact bus.

FIGS. 7A and 7B illustrate two possible configurations for an intersection between a MOSFET cell and a submerged body bus. In FIG. 7A, the N+ source has been interrupted, whereas in FIG. 7B the N+ source region 77 has been allowed to continue over the submerged P+ bus 70. In the configuration of FIG. 7B the breakdown voltage of the diode (D1) between the deep P+ bus 70 and the N+ source region 77 is lower than in the embodiment of FIG. 7A. Nonetheless, the embodiment of FIG. 7B produces a more robust device having very good parasitic PNP supression.

Figure 8:
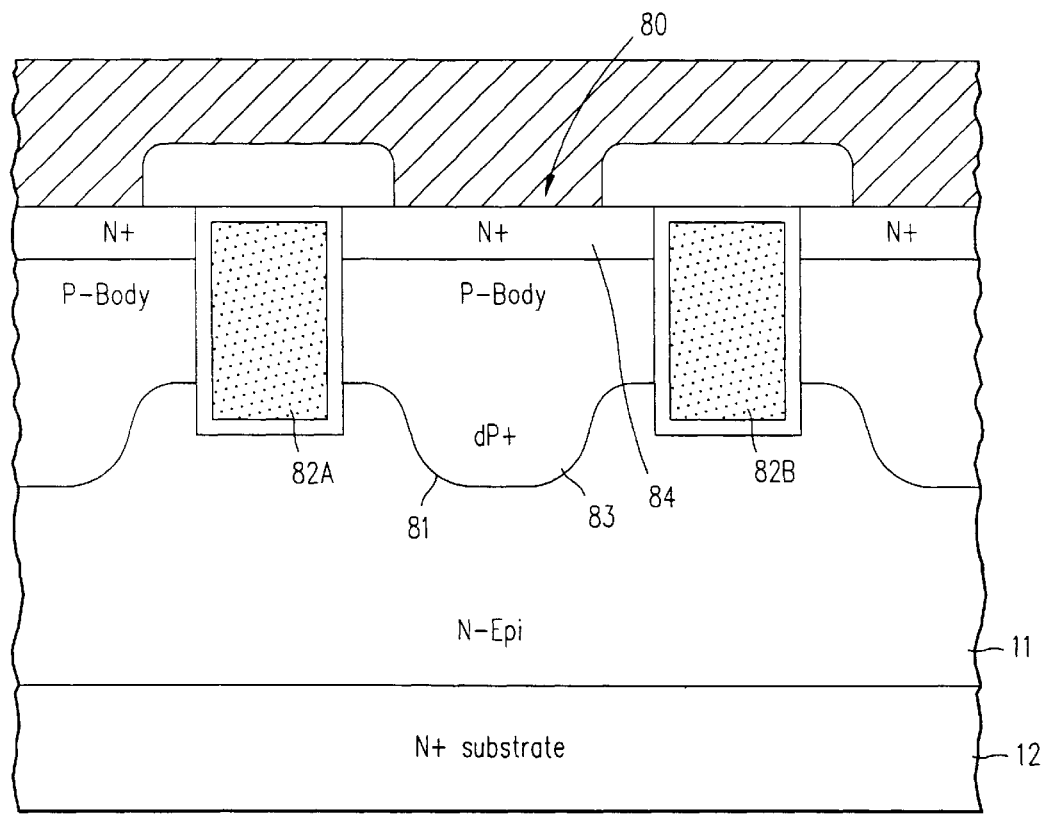
FIG. 8 illustrates an alternative embodiment which includes a deep central diffusion at the center of the MOSFET cells in order to limit the strength of the electric field at the corners of the trenches.

In fact, a deep P+ region may be added to every MOSFET cell, as shown in FIG. 8., which shows a deep P+ diffusion 81 in a MOSFET cell 80. Deep P+ diffusion 81 reduces the electric field at the corners of trenches 82A and 82B in the manner taught in U.S. Pat. No. 5,072,266, but the P body 83 is not shorted to the N+ source 84. Note that FIG. 8 is a cross-sectional view taken through the MOSFET cell 80 whereas FIGS. 7A and 7B are cross-sectional views taken through the intersection of a submerged P+ bus and the extension of a MOSFET cell.

For example, the embodiments of FIGS. 7B and 8 might have a breakdown voltage of 6V between the source and body regions. Therefore, these embodiments might be entirely adequate if the bidirectional MOSFET only needs to block a voltage of 3V. However, if the applied voltage is 8V, the MOSFET would be inadequate because then a breakdown voltage of 10V to 12V would be required. Moreover, the on-resistance of the MOSFET shown in FIG. 8 would generally be higher than the on-resistance of the MOSFET shown in FIGS. 1 and 2 because the deep P+ region within the MOSFET cell may spread laterally. Therefore, the gates must be separated further to prevent the P+ dopant from getting into the channel region and thereby altering the threshold voltage of the MOSFET. Separating the gates reduces the cell density and generally increases the on-resistance of the device.

Figure 10:
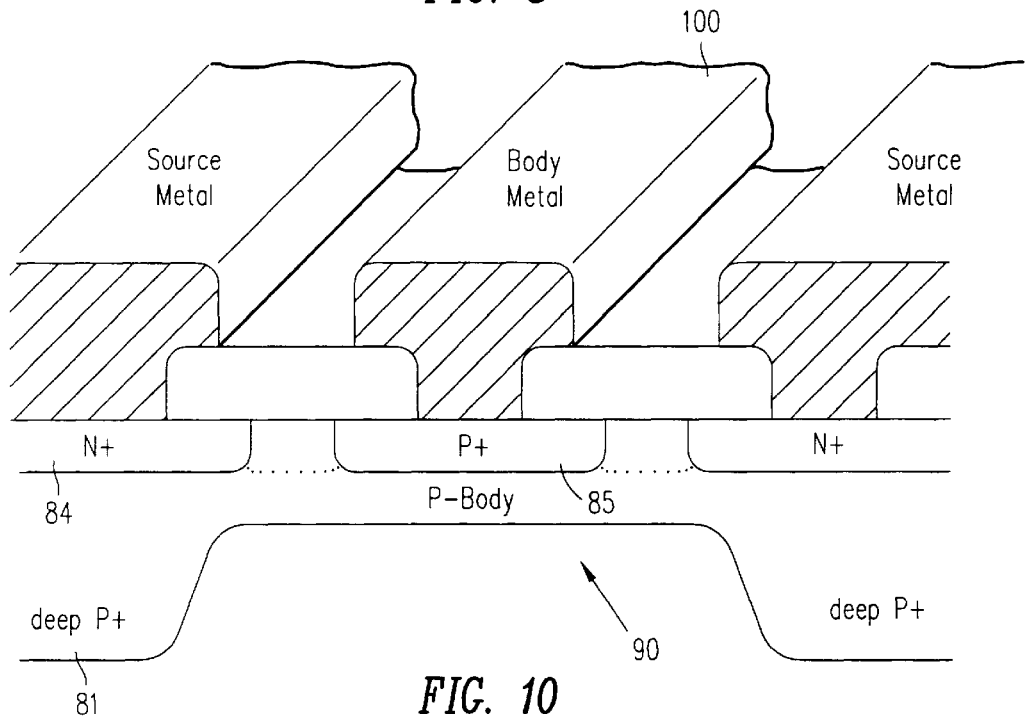
FIG. 10 illustrates another cross-sectional view of the embodiment shown in FIG. 8.
Figure 9:
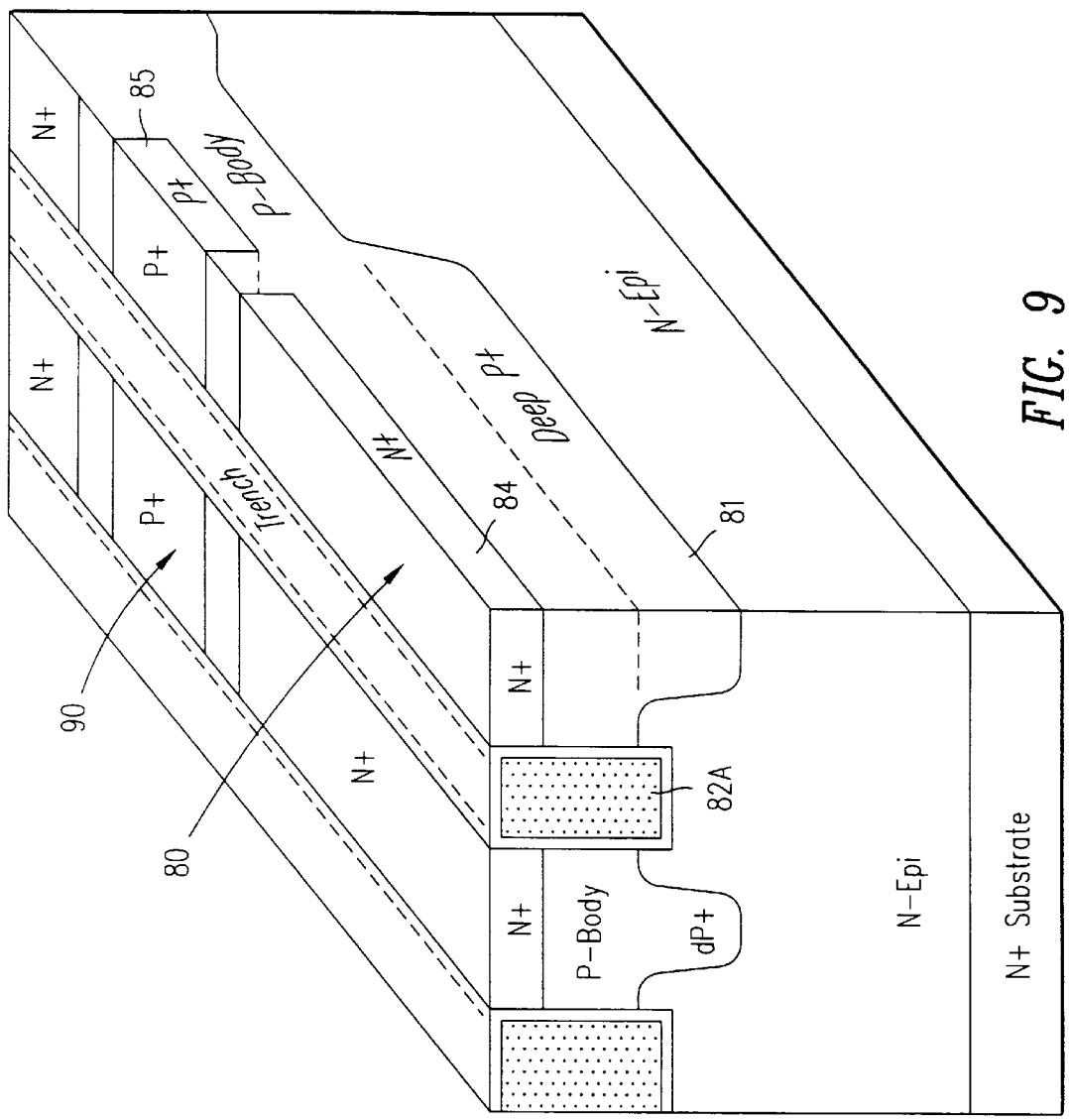
FIG. 9 illustrates a three-dimensional cross-sectional view of the embodiment shown in FIG. 8.

FIG. 9 illustrates a three-dimensional view of the embodiment shown in FIG. 8, showing that the deep P+ diffusion 81 is interrupted in a body contact region 90. (A metal bus on the surface in body contact region 90 is not shown.) As shown in FIG. 10, which is a cross-sectional view taken from the right side of FIG. 9, deep P+ diffusion 81 is terminated before the end of N+ source 84 to avoid an N+/P+ junction at the surface which would reduce the breakdown voltage of the source-to-body diode (D1). If P+ diffusion 81 extends beyond the end of N+ source 84, the P+ dopant would appear at the surface adjacent the N+ source, since any diffusion has its highest concentration at the surface of the semiconductor material. Similarly, as shown in FIG. 10, the shallow P+ contact region 85 should be applied through a mask to prevent it from spreading laterally to meet N+ source 84 (as shown by the dotted lines in FIG. 10). Alternatively, a deep P+ diffusion could be used in place of shallow P+ region 85, but it would have to be spaced far enough from N+ source 84 to prevent the two heavily doped regions from merging. This would tend to decrease the cell density. FIG. 10 also shows a metal body contact bus 100 at the surface of the P+ contact region 85.

Figure 11:
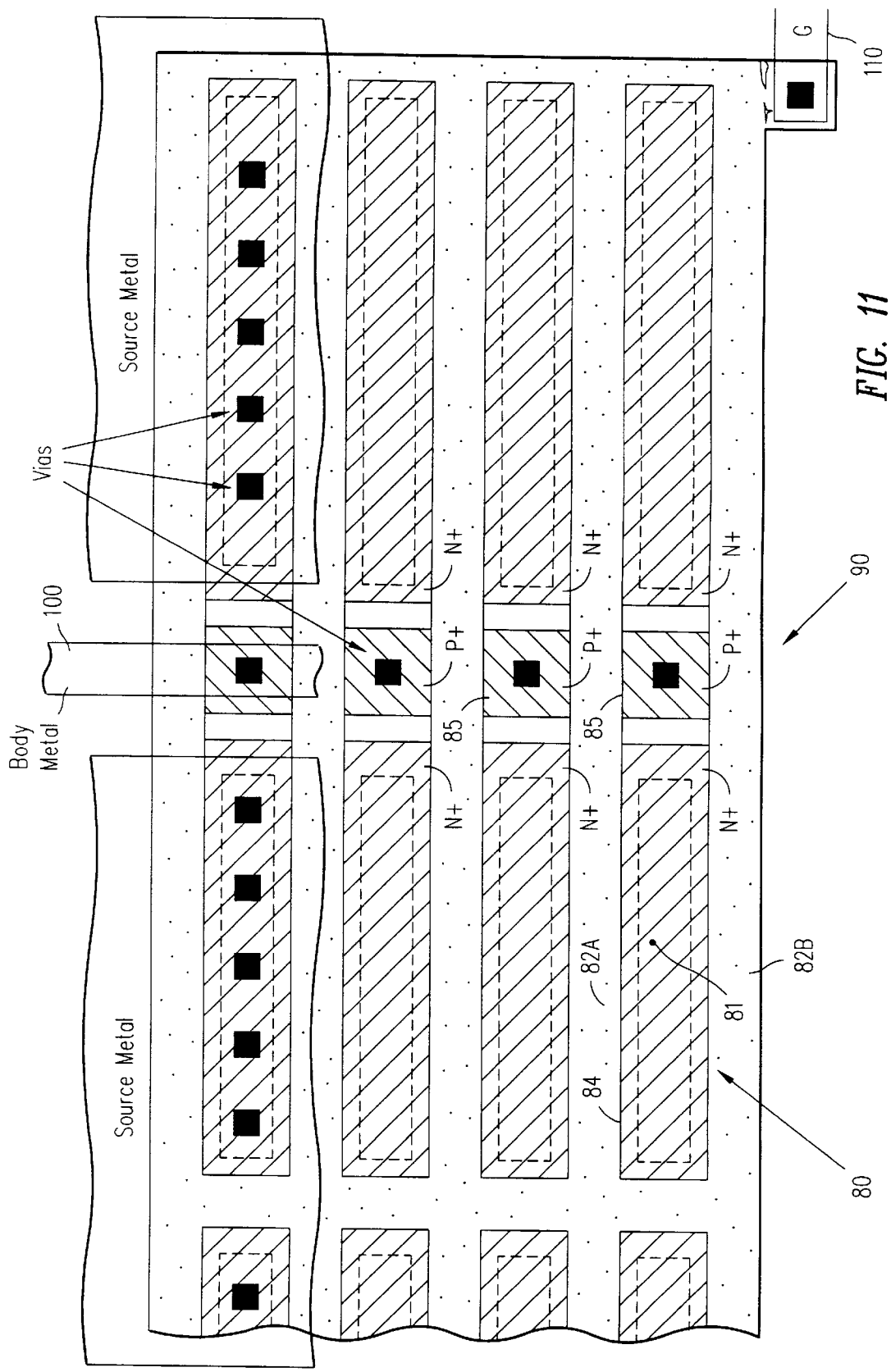
FIG. 11 illustrates a top view of the power MOSFET shown in FIG. 8.

FIG. 11 illustrates a broken-away top view of a portion of a chip which contains the embodiments shown in FIGS. 8–10. Note in particular the deep P+ regions within each cell (represented by the dashed lines) which are held back laterally from the perimeter of the N+ source regions (exemplified by region 84). Note also that the N+ source regions are spaced from the shallow P+ region 85. A gate contact bus 110 which makes contact with gates 82A and 82B is also shown. Although there are numerous processes for fabricating a MOSFET in accordance with this invention, FIGS. 16A–16E illustrate an exemplary process for fabricating MOSFET 10 shown in FIG. 1.

Figure 16E:
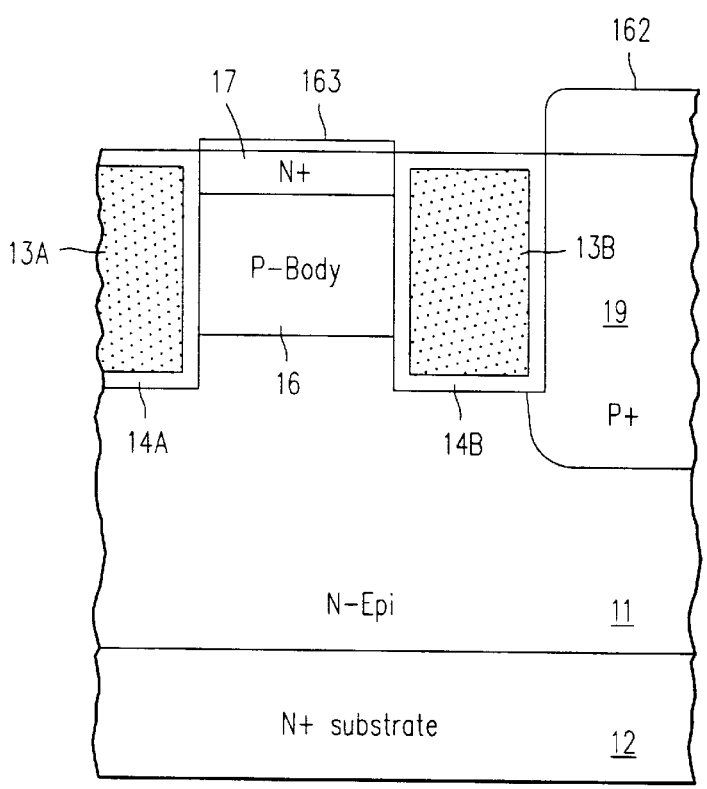
FIGS. 16A–16E illustrate steps in a process of fabricating a trench power MOSFET in accordance with this invention.
Figure 16A:
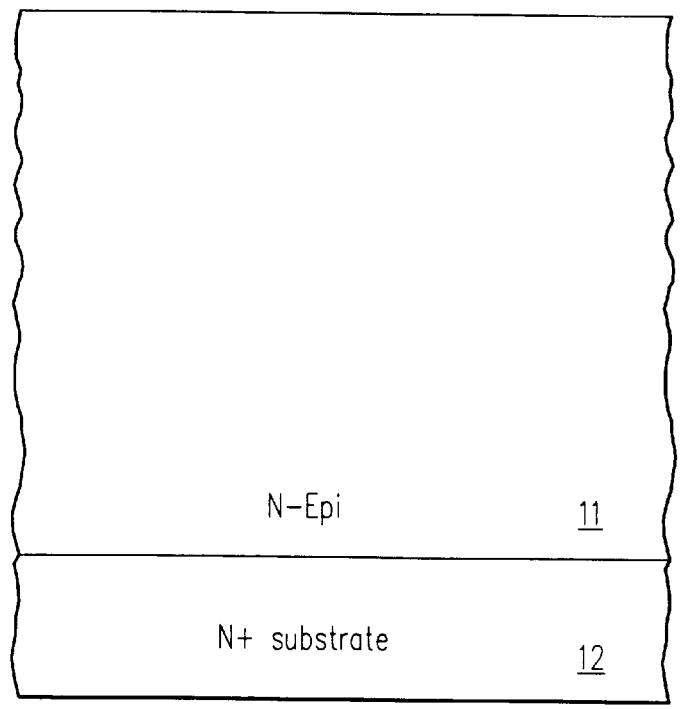

Referring to FIG. 16A, the starting point is a conventional N+ substrate 12 with a typical resistivity of 3 mΩ-cm on which an N-epitaxial layer 11 is grown using known processes. N-epitaxial layer 11 is typically 1 to 10 μm thick and is doped to a concentration of $1 \times 10^{15}$ to $1 \times 10^{17}$ cm$^{-3}$. A concentration of $5 \times 10^{16}$ cm$^{-3}$ is common.

Figure 16B:
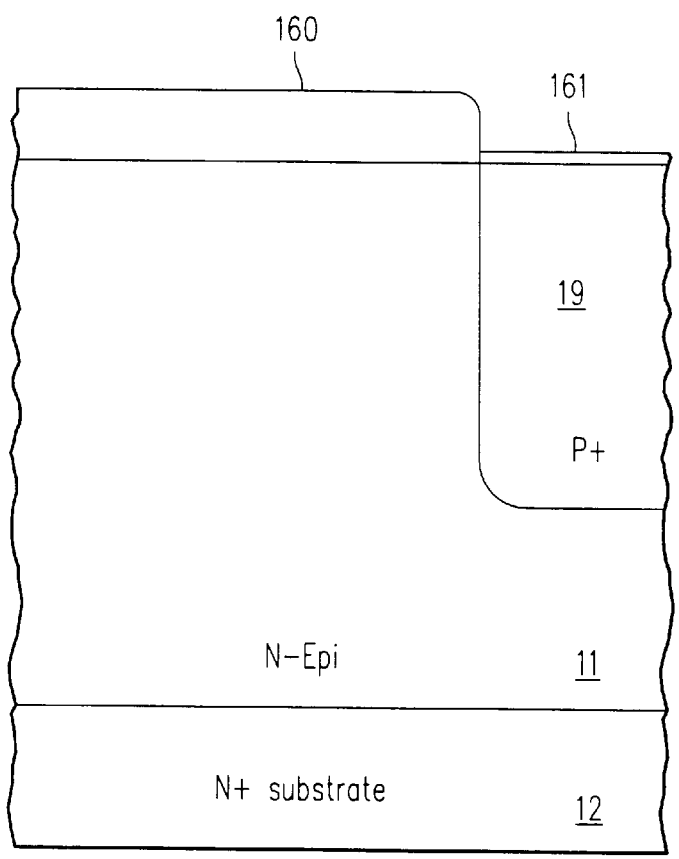

A thick oxide layer 160 is grown, masked and etched, and a thin oxide layer 161 is grown on the top surface of the structure where deep P+ region 19 is to be formed. Deep P+ region 19 is then implanted through thin oxide layer 161 at a dose of $1 \times 10^{14}$ to $7 \times 10^{15}$ cm$^{-2}$ and an energy of 60–100 keV. Alternatively, a solid source wafer such as BN can be used to form the deep P+ region through predeposition. The resulting structure is illustrated in FIG. 16B. Thick oxide layer 160 is also etched in the region where deep P+ region 35 is to be formed (see FIGS. 3A and 3B), although this is not visible in FIG. 16B. Deep P+ region 35 is typically implanted along with deep P+ region 19. Oxide layers 160 and 161 are then removed.

Figure 16C:
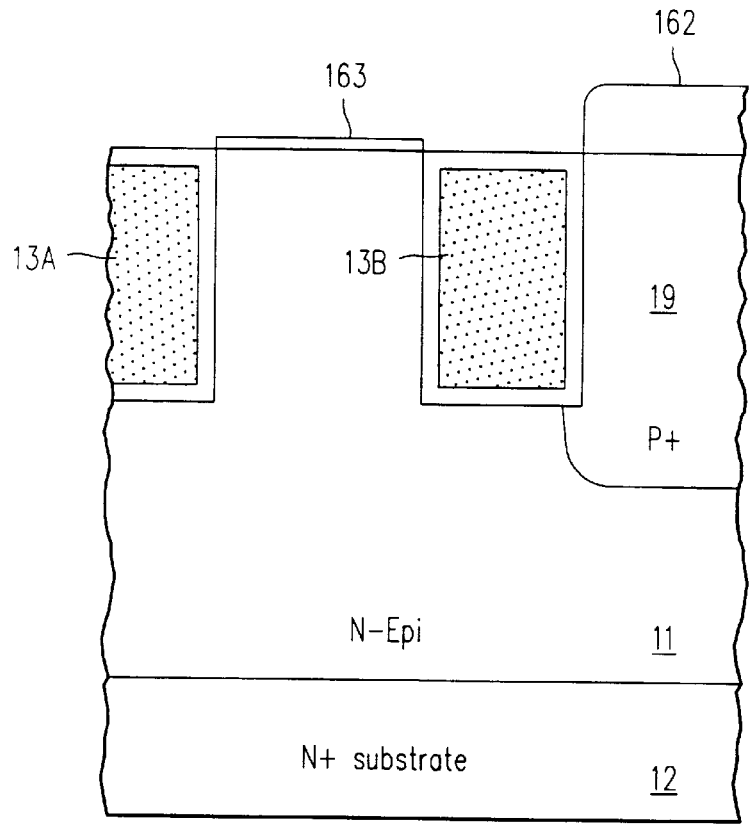

In one version of the process, a thick oxide layer 162 is grown and removed by photomasking except over P+ region 18 and deep P+ region 19, and a thin oxide layer 163 is grown. Thin oxide layer 163 is masked and removed from the portions of the structure where the trenches are to be formed, as shown in FIG. 16C. The trenches are then masked and etched using known techniques of reactive ion or plasma dry etching. Then the trench is oxidized to form the gate oxide layers 14A and 14B, and polysilicon is deposited into the trench until it overflows the top of the trench. The polysilicon is then doped with phosphorus by POCl$_3$ predeposition or ion implantation at a dose of $5 \times 10^{13}$ to $5 \times 10^{15}$ cm$^{-2}$ and an energy of 60 keV, giving it a sheet resistance of 20–70Ω/□. For a P-channel device, the polysilicon is doped with boron using ion implantation to a sheet resistance of roughly 40–120Ω/□. The polysilicon is then etched back until it is planar with the surface of the trench except where a mask protects it, so that it can subsequently be contacted with metal.

Figure 16D:
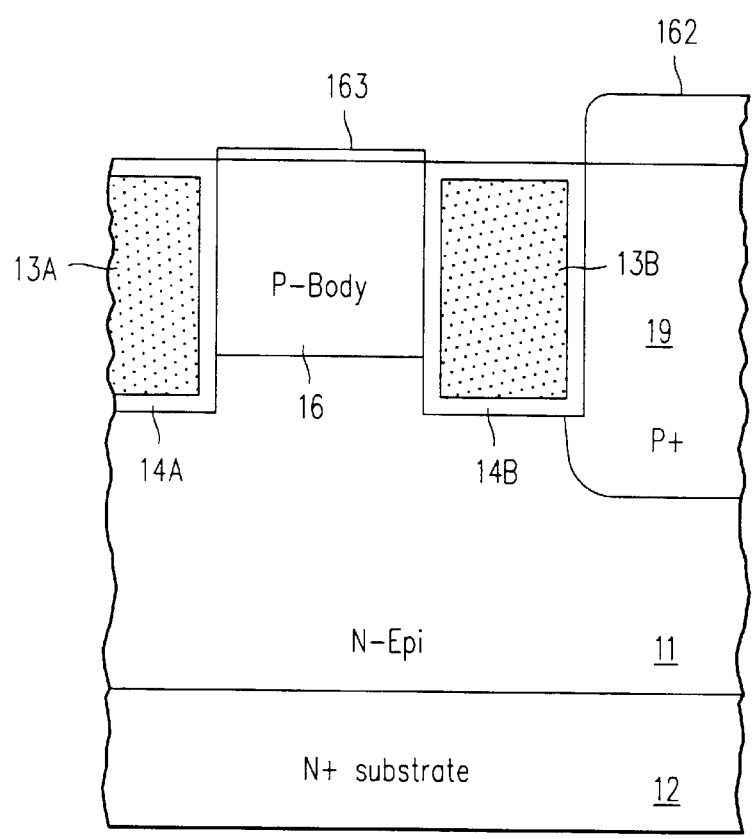

P-body 16 is then implanted through the thin oxide layer 163 (e.g., boron at a dose of $1 \times 10^{13}$ to $4 \times 10^{14}$ cm$^{-2}$ and an energy of 40–100 keV). A similar method is used in fabricating a P-channel device except that the dopant is phosphorus. The resulting structure is illustrated in FIG. 16D.

The N+ source region 17 is then introduced using a mask and an arsenic ion implantation (or a boron ion implantation for a P-channel device) at a dose of $5 \times 10^4$ to $1 \times 10^{16}$ cm$^{-2}$ at 20 to 100 keV. The resulting structure is shown in FIG. 16E.

Following the formation of the N+ source region 17, a new mask is formed and the shallow P+ region 18 that is used to contact P-body 16 (see FIGS. 3A and 3B) is introduced by ion implantation at a dose of $1 \times 10^{13}$ to $5 \times 10^{14}$ cm$^{-2}$ at 20–80 keV, taking care to make sure that there is a lateral separation between shallow P+ region 18 and N+ source region 17. Alternatively, the P+ implant can be blanketed into all regions, provided that its dose is sufficiently low to avoid degradation of the surface breakdown between the N+ source and the P-body regions. In yet another embodiment, the P+ implant is performed after the contact mask step.

This yields MOSFET 10 shown in FIG. 1. A thin oxide layer is thermally grown. Borophosphosilicate glass (BPSG) is then deposited on the top surface of the structure. The BPSG is momentarily heated to around 850° to 950° C. to flow smoothly and flatten the surface topology of the die. Contact holes 23, 24, 33 and 34 are etched in the oxide and BPSG layers, and a metal layer is deposited, forming contacts to N+ source regions 17, deep P+ regions 19, shallow P+ regions 18 and deep P+ regions 35, respectively, through the contact holes. The metal layer is then patterned to form the source contact bus 20 and the body contact bus 21. Gate buses are also formed by metal stripes which contact the polysilicon gate at various regions in the device and at least around the periphery of the active cells. This yields the structure shown in FIGS. 2, 3A and 3B.

The die is then passivated with SiN or low-temperature BPSG, and pad mask windows are etched to facilitate bonding.

Figure 12:
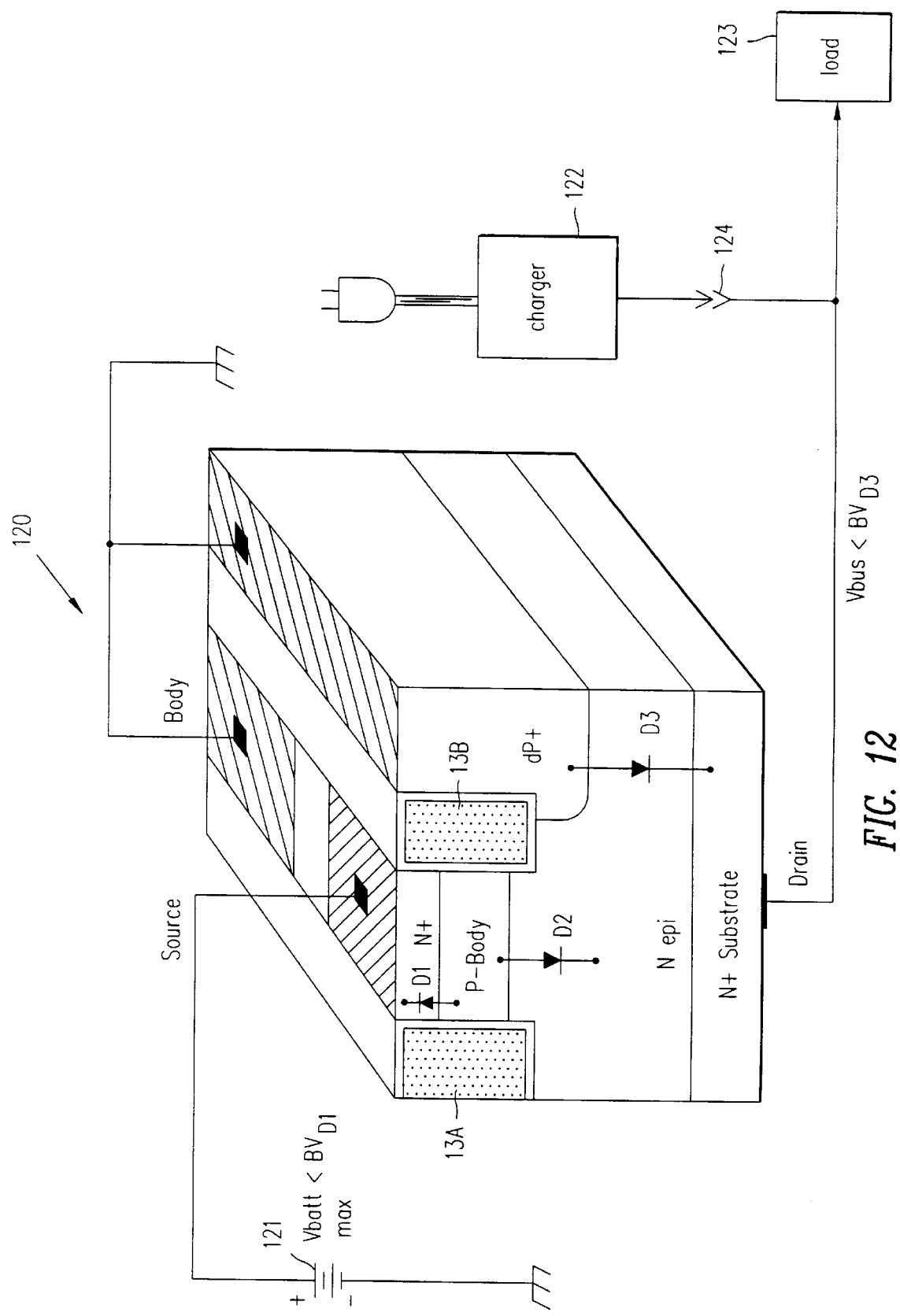
FIG. 12 illustrates a trench power MOSFET according to this invention connected as a high-side switch between a battery and a battery charger and a load.

FIGS. 12–15 illustrate several novel uses of the bidirectional MOSFET switch shown in FIG. 1. FIG. 12 illustrates a MOSFET 120 connected as a high-side switch between a battery 121, a battery charger 122 and a load 123. The source-to-body diode D1, the drain-to-body diode D2 and the deep P+-to-drain diode D3 are shown.

The body of MOSFET 120 is connected to ground, thereby enabling MOSFET 120 to block current from either battery 121 or battery charger 122. When MOSFET 120 is turned on, current flows from battery 121 to load 123. When MOSFET 120 is turned off, diode D1 prevents current from flowing from battery 121 to load 123. The breakdown voltage of diode D1 must therefor be greater than the maximum voltage of battery 121.

Battery charger 122 is connected to the system through an interlock 124. When battery charger 122 and MOSFET 120 are both turned on, current flows through MOSFET 122 to battery 121. When MOSFET 120 is turned off, it must also be capable of blocking current from charger 122. Thus the breakdown voltage of diode D3 must be greater than the maximum output voltage of charger 122. The state of MOSFET 120 is controlled by a contact to gates 13A and 13B (not shown).

Figure 13:
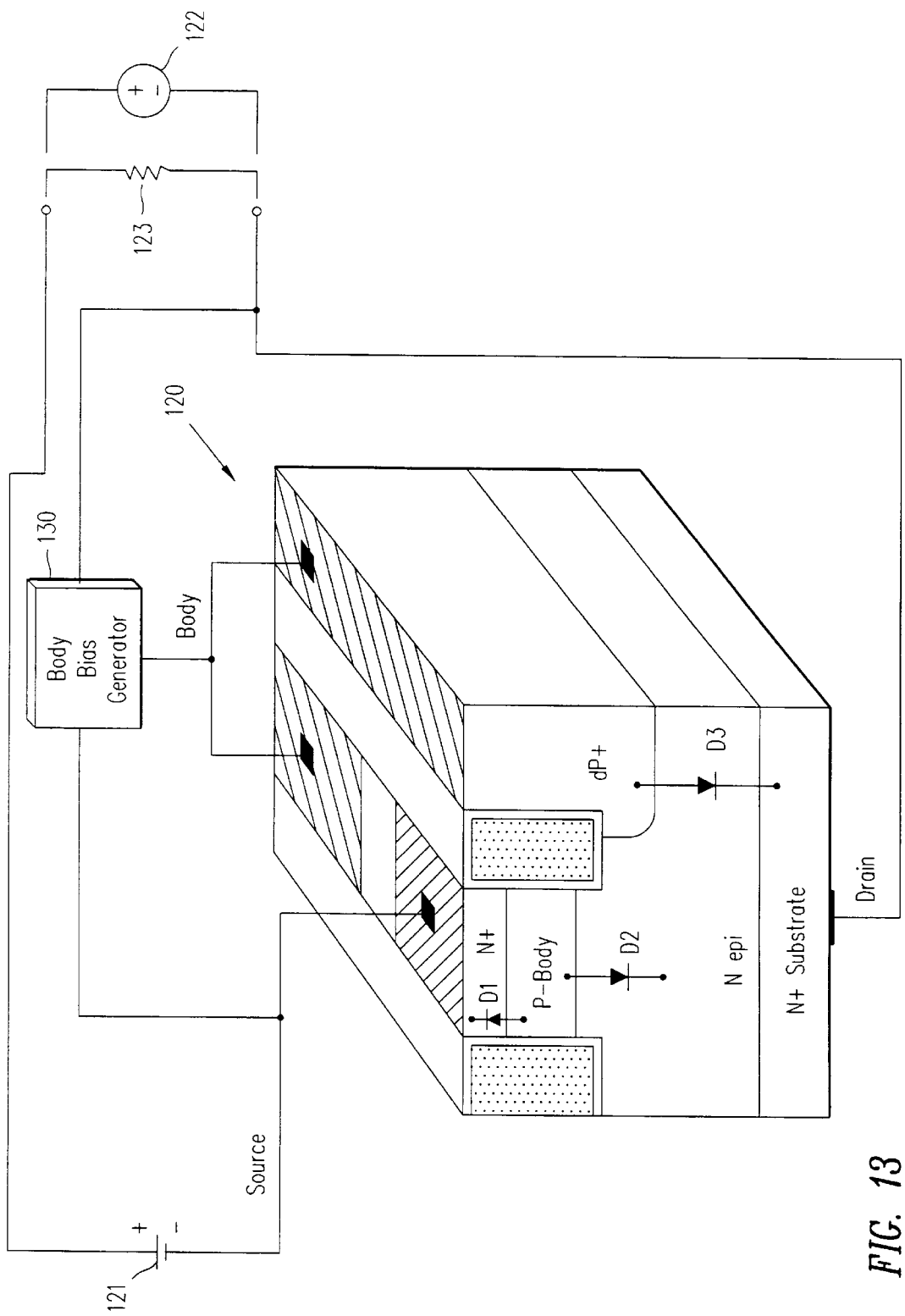
FIG. 13 illustrates a trench power MOSFET according to this invention connected as a low-side switch between a battery and a load.

FIG. 13 shows MOSFET 120 connected as a low-side switch between battery 121 and load 123. In this embodiment, a body bias generator 130 is used to control the bias of the body of MOSFET 120. Body bias generator 130 connects the body to the source or drain terminal of the MOSFET, whichever is at a lower voltage. Battery charger 122 is substituted for load 123 when battery 121 is to be charged.

Figure 14:
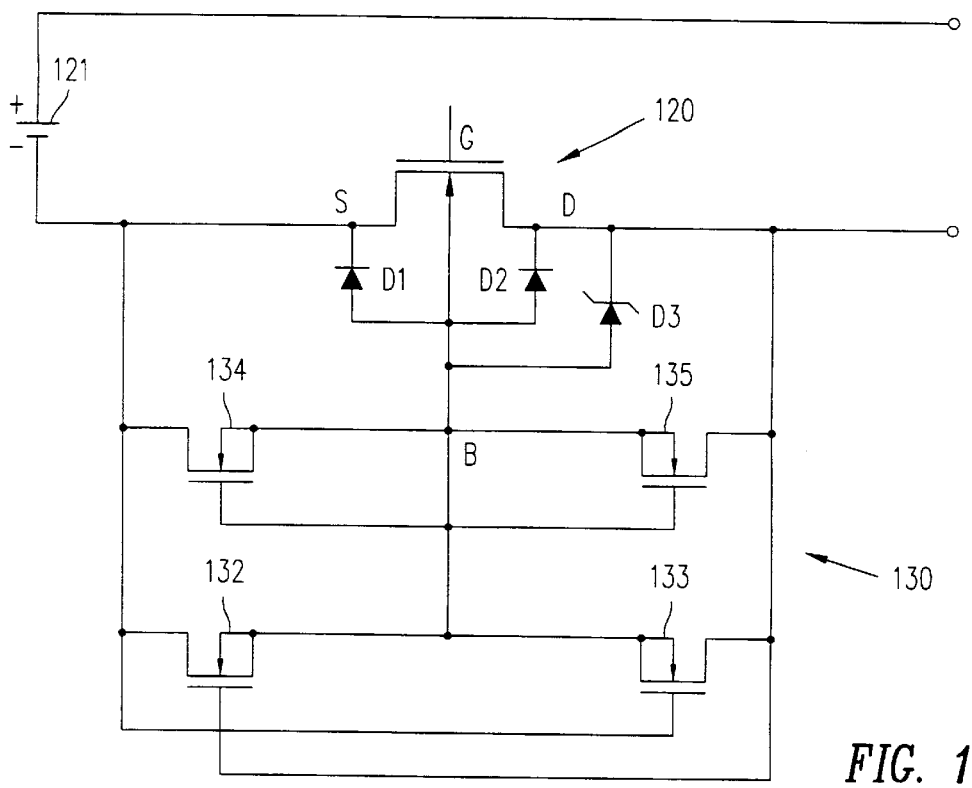
FIG. 14 illustrates a circuit diagram of the body biased generator shown in FIG. 13.

FIG. 14 illustrates a circuit diagram of body bias generator 130, which includes a first pair of MOSFETs 132 and 133 and a second pair of MOSFETs 134 and 135. MOSFET 132 is connected between the source and body of MOSFET 120, and MOSFET 133 is connected between the drain and body of MOSFET 120, with the source terminals of MOSFETs 132 and 133 being connected to the body of MOSFET 120. MOSFETs 132 and 133 contain a conventional source-body short. The gate of MOSFET 132 is connected to the drain of MOSFET 120, and the gate of MOSFET 133 is connected to the source of MOSFET 120.

MOSFETs 134 and 135 are connected in parallel with MOSFETs 132 and 133, respectively. The gate terminals of MOSFETs 134 and 135, however, are connected in common to the body of MOSFET 120. The source and body terminals of MOSFETs 134 and 135 are shorted in the conventional manner to the body of MOSFET 120.

MOSFETs 132 and 133 function to short the body of MOSFET 120 to whichever of the source and drain terminals of MOSFET 120 is at a lower voltage. MOSFETs 134 and 135 function to prevent the body of MOSFET 120 from "floating" upward to an excessive degree when MOSFETs 132 and 133 are both turned off.

The operation of MOSFETs 132 and 133 will be described first. Because the gate terminals of MOSFETs 132 and 133 are cross-coupled to the drain and source terminals of MOSFET 120, respectively, MOSFET 132 will turn on whenever the voltage at the drain exceeds the voltage at the source of MOSFET 120, and MOSFET 133 will turn on whenever the voltage at the source exceeds the voltage at the drain of MOSFET 120. In other words, MOSFET 132 functions to short the source and body of MOSFET 120 when the voltage at the source is lower than the voltage at the drain of MOSFET 120, and MOSFET 133 functions to short the body and drain of MOSFET 120 when the voltage at the drain is lower than the voltage at the source of MOSFET 120. Thus, the coordinated operation of MOSFETs 132 and 133 ensures that the body of MOSFET 120 is clamped to whichever of the drain and source terminals of MOSFET 120 is biased most negatively. This assumes, of course, that the gate-to-source voltage of one of MOSFETs 132 and 133 exceeds the threshold voltage necessary to turn the MOSFET on.

When MOSFET 120 is connected to a load or to a battery charger with its terminals reversed, the source of MOSFET 120 is biased most negatively. The maximum voltage that MOSFET 120 would normally have to withstand for a fully charged battery connected to a load is the battery voltage. In the reversed battery charger condition, diode D3 within MOSFET 120 must have a breakdown voltage which is greater than the combined voltages of battery 121 and the battery charger. Whichever of MOSFETs 132 and 133 is turned off must also be able to withstand these voltages.

When the battery charger is properly connected, the negative terminal of the charger (not the battery) is the most negative point in the system, and MOSFET 133 therefore turns on. When MOSFET 120 is off, the voltage across MOSFET 120 is equal to battery charger voltage minus the battery voltage. As the battery charges, the voltage across MOSFET 120 declines.

Body bias generator 130 is further described in application Ser. No. 08/367,515, filed Dec. 30, 1994, now U.S. Pat. No. 5,689,209, issued on Nov. 18, 1997, which is incorporated herein by reference in its entirety.

Figure 15:
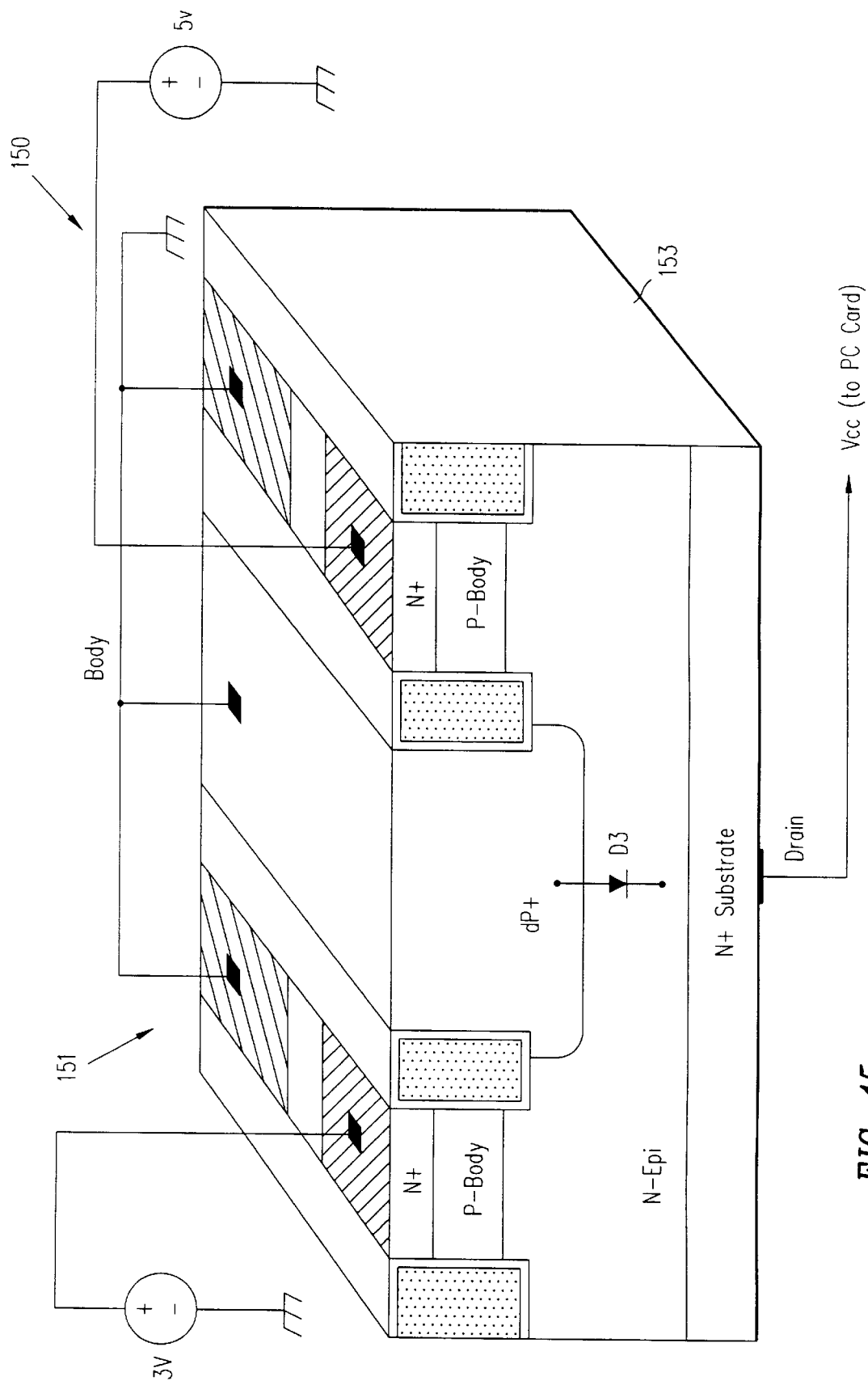
FIG. 15 illustrates a pair of power MOSFET switches according to this invention connected between a 3V source and a 5V source and a load such as a PC card.

FIG. 15 illustrates an embodiment in which a pair of MOSFETs 150 and 155 are fabricated in a single substrate 153. MOSFET 150 is connected to a 5V supply and MOSFET 151 is connected to a 3V supply. MOSFETs 150 and 151 share a common drain, which may be connected to a load, such as a PC memory card, which requires alternative supply voltages.

The body terminals of MOSFET 150 and 151 are both connected to ground.

When MOSFET 150 is turned on so as to connect the 5V supply to the load, the drain rises to approximately 5V, reverse biasing diode D3. Thus diode D3 must have a breakdown voltage somewhat in excess of 5V. In this condition, MOSFET 151 is turned off.

If MOSFET 151 is turned on so as to connect the 3V source to the load, the drain terminal rises to approximately 3V. Again, diode D3 is reversed-biased. In this condition, MOSFET 150 is turned off.

While the embodiments described above relate to MOSFET cells in the form of parallel stripes, the principles of this invention are equally applicable to MOSFETs which have closed cells in square, hexagonal or other shapes. Embodiments which include closed cells, however, will normally require two metal layers in order to make the necessary corrections to the body and source regions.

While specific embodiments in accordance with this invention have been described, these embodiments are to be considered as illustrative and not limiting. Numerous alternative embodiments will be apparent to those skilled in the art, all of which are within the broad scope of this invention.

What is claimed is:

1. A method of forming a trench power MOSFET comprising:

providing a semiconductor substrate of a first conductivity type;

growing an epitaxial layer of the first conductivity type on the substrate;

forming a first mask layer on a surface of the epitaxial layer, the first mask layer having a first opening;

implanting dopant of a second conductivity type opposite to the first conductivity type through the first opening to form a deep diffusion of the second conductivity type in the epitaxial layer;

removing the first mask layer; forming a second mask layer on the surface of the epitaxial layer, the second mask layer having a second opening;

etching the epitaxial layer through the second opening to form a trench in the epitaxial layer;

forming a first insulating layer on a wall of the trench;

introducing a conductive gate material into the trench;

implanting dopant of the second conductivity type to form a body region adjacent the trench;

implanting dopant of the first conductivity type in a first area of the surface of the epitaxial layer to form a source region adjacent the trench and the surface of the epitaxial layer;

implanting dopant of the second conductivity type in a second area of the surface of the epitaxial layer to form a body contact region adjacent the second area of the surface of the epitaxial layer, the body contact region adjoining and being more heavily doped than the body region, the second area occupied by the body contact region at the surface of the epitaxial layer being spaced apart from the first area occupied by the source region at the surface of the epitaxial layer;

forming a second insulating layer over the surface of the epitaxial layer;

forming first, second and third contact openings through the second insulating layer, the first contact opening exposing a portion of the source region, the second contact opening exposing a portion of the body contact region, and the third contact opening exposing a portion of the deep diffusion;

depositing a metal layer, the metal layer making electrical contact with the source region, body contact region and deep diffusion through the first, second and third contact openings, respectively; and separating the metal layer into a source contact bus and a body contact bus, the source contact bus including a portion of the metal layer which extends into the first opening and the body contact bus including a portion of the metal layer which extends into the second and third openings.

2. The method of claim 1 wherein the deep diffusion is formed such that a bottom of the deep diffusion is from 0.5 to 2.0 µm from the substrate.

3. The method of claim 1 wherein the deep diffusion is formed adjacent a wall of the trench, method further comprising:

implanting dopant of the second conductivity type to form a second deep diffusion extending in a direction generally orthogonal to the deep diffusion;

forming a fourth contact opening through the second insulating layer, the fourth contact opening exposing the second deep diffusion;

depositing the metal layer such that the metal layer makes electrical contact with the second deep diffusion through the fourth contact opening; and separating the metal layer into the source contact bus and the body contact bus such that the body contact bus includes a portion of the metal layer that extends into the fourth contact opening.

4. A method of forming a trench power MOSFET comprising:

providing a semiconductor substrate of a first conductivity type;

growing an epitaxial layer of the first conductivity type on the substrate;

forming a first mask layer on a surface of the epitaxial layer, the first mask layer having a first opening;

implanting dopant of a second conductivity type opposite to the first conductivity type through the first opening to form a deep diffusion of the second conductivity type in the epitaxial layer, the deep diffusion including a first longitudinal portion which extends in a first direction and a second longitudinal portion which extends in a second direction orthogonal to the first longitudinal portion;

removing the first mask layer;

forming a second mask layer on the surface of the epitaxial layer, the second mask layer having a second opening;

etching the epitaxial layer through the second opening to form a trench in the epitaxial layer, the trench extending longitudinally in the first direction and being positioned adjacent the first longitudinal portion of the deep diffusion and extending through the second longitudinal portion of the deep diffusion, a bottom of the second longitudinal portion of the deep diffusion being at a level in the epitaxial layer below a bottom of the trench;

forming a first insulating layer on a wall of the trench;

introducing a conductive gate material into the trench;

implanting dopant of the second conductivity type to form a body region adjacent the trench on an opposite side of the trench from the first longitudinal portion of the deep diffusion, the body region being in electrical contact with the second longitudinal portion of the deep diffusion; and implanting dopant of the first conductivity type to form a source region adjacent the trench and the surface of the epitaxial layer.

\* \* \* \* \*